US007019369B2

(12) United States Patent
Sato

(10) Patent No.: US 7,019,369 B2
(45) Date of Patent: Mar. 28, 2006

(54) STATIC RANDOM ACCESS MEMORY AND SEMICONDUCTOR DEVICE USING MOS TRANSISTORS HAVING CHANNEL REGION ELECTRICALLY CONNECTED WITH GATE

(75) Inventor: Yuichi Sato, Nara-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/774,536

(22) Filed: Feb. 10, 2004

(65) Prior Publication Data

US 2004/0159905 A1    Aug. 19, 2004

Related U.S. Application Data

(63) Continuation of application No. 09/412,328, filed on Oct. 5, 1999, now Pat. No. 6,724,065.

(30) Foreign Application Priority Data

Oct. 5, 1998    (JP)    ................................. 10-282335

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ........................ 257/393; 257/903; 257/368

(58) Field of Classification Search ................ 257/506, 257/393, 903, 368
See application file for complete search history.

(56) References Cited

U.S. PATENT DOCUMENTS

| 5,780,899 A | * | 7/1998 | Hu et al. ..................... 257/335 |
| 5,831,897 A | * | 11/1998 | Hodges ........................ 365/156 |
| 5,831,899 A | | 11/1998 | Wang et al. |
| 5,960,289 A | * | 9/1999 | Tsui et al. ................... 438/275 |
| 6,020,222 A | | 2/2000 | Wollesen |

FOREIGN PATENT DOCUMENTS

| JP | A-54-037544 | 3/1979 |
| JP | A-61-185972 | 8/1986 |
| JP | 3022476 | 1/1991 |
| JP | A-04-053090 | 2/1992 |
| JP | A-07-161844 | 6/1995 |
| JP | A-07-176633 | 5/1996 |
| JP | A-10-222985 | 8/1998 |

OTHER PUBLICATIONS

Hodges et al. "Analysis and Design of Integrated Circuits" 1988, McGraw-Hill pp368,369.*

(Continued)

*Primary Examiner*—Phat X. Cao
(74) *Attorney, Agent, or Firm*—Morrison & Foerster LLP

(57) ABSTRACT

In an SRAM, memory cells are each constructed of four NMOS transistors and two PMOS transistors 25 and 26. The four NMOS transistors are each constructed of DTMOS in which the channel region is electrically connected to the gate. In each NMOS transistor, a threshold voltage Vth is lower in an ON stage than in an OFF stage. The threshold voltage Vth in the OFF stage is equivalent to that of an ordinary NMOS transistor in which the channel region is not electrically connected to the gate. Read and write circuits of the SRAM also include MOS transistors formed of DTMOS in which the channel region is electrically connected to the gate.

1 Claim, 5 Drawing Sheets

OTHER PUBLICATIONS

"*Principles of CMOS VLSI Design*", A Systems Perspective, Second Edition, , Neil H.E. Weste and Kamran Eshraghian, Chapter 10, pp 578-583, 1992.

F. Assaderaghi et al., "Dynamic threshold-voltage MOSFET (DTMOS) for ultra-low voltage VLSI", IEEE Transactions on Electron Devices, vol. 44, No. 3, pp. 414-422, Mar. 1997.

Assaderaghi et al., 1994 "A dynamic threshold voltage MOSFET (DTMOS) for very low voltage operation" IEEE Electron Device Letters vol. 15, pp 510-512.

Andoh et al., 1994 "Design methodology for low-voltage MOSFETS" IEEE International Electron Devices Meeting, Technical Digest, pp 79-82.

Assaderaghi et al., 1994 "A dynamic threshold voltage MOSFET (DTMOS) for ultra-low voltage operation" IEEE International Electron Devices Meeting, Technical Digest, pp 809-812.

David A. Hodges et al., "Analysis and design of digital integrated circuits", second edition, McGraw-Hill, Inc., pp 368-369; 1988.

* cited by examiner

STATIC RANDOM ACCESS MEMORY AND SEMICONDUCTOR DEVICE USING MOS TRANSISTORS HAVING CHANNEL REGION ELECTRICALLY CONNECTED WITH GATE

This application is a continuation of Ser. No. 09/412,328 filed Oct. 5, 1999, now U.S. Pat. No. 6,724,065.

BACKGROUND OF THE INVENTION

The present invention relates to a static random access memory ("SRAM" hereinafter) and a semiconductor device.

By virtue of the progress of microfabrication technology, the operation speed and the integration degree of LSIs (Large Scale Integrated Circuits) have been increasing in recent years. In order to put an LSI that operates at high speed into practical use, the reduction in consumption of power of the LSI is one of important technical requirements. That is, generally, the consumption of power increases when an LSI is operated at high speed. Therefore, in order to stably operate the LSI, a ceramic package and radiator fins and so on are needed, resulting in an increased cost. In recent years portable devices have been advancing toward further reduction in size and weight, and the reduction in consumption of power is important also in achieving the long-time use of the devices on batteries as well.

Conventionally, an SRAM cell constructed of four N-type MOS (Metal-Oxide Semiconductor) transistors and two P-type MOS transistors has generally been used. FIG. 9 shows a circuit diagram of a conventional SRAM cell constructed of four N-type MOS ("NMOS" hereinafter) transistors and two P-type MOS ("PMOS" hereinafter) transistors. FIG. 10 shows the layout of the whole SRAM that employs the SRAM cells having the above construction.

Referring to FIG. 10, the SRAM 1 is constructed roughly of an input/output interface section 2, a memory section 3 through which the SRAM cells are spread, an address decoder section 4 and a data write/read control section 5. The SRAM cells that constitute the memory section 3 have the construction shown in FIG. 9. That is, a bit line B is connected to the source (drain) of a first NMOS transistor 11. A word line WL is connected to the gates of the first NMOS transistor 11 and a second NMOS transistor 12. An inverted bit line BX is connected to the source (drain) of the second NMOS transistor 12.

A drain (source) Y that belongs to the first NMOS transistor 11 and is not connected to the bit line B is connected to the gates of a third NMOS transistor 13 and a first PMOS transistor 15 and further connected to the drains of a fourth NMOS transistor 14 and a second PMOS transistor 16.

A drain (source) XY that belongs to the second NMOS transistor 12 and is not connected to the inverted bit line BX is connected to the gates of the fourth NMOS transistor 14 and the second PMOS transistor 16 and further connected to the drains of the third NMOS transistor 13 and the first PMOS transistor 15.

The sources of the third NMOS transistor 13 and the fourth NMOS transistor 14 are connected to GND, while the sources of the first PMOS transistor 15 and the second PMOS transistor 16 are connected to VDD.

In the above arrangement, semiconductor regions in which a channel is formed when each of the first NMOS transistor 11 through fourth NMOS transistor 14 is turned on are connected to GND. On the other hand, other semiconductor regions in which a channel is formed when each of the first PMOS transistor 15 and the second PMOS transistor 16 is turned on are connected to VDD.

However, the above conventional SRAM has the following problems. That is, in accomplishing a reduced power consumption of the SRAM, a great effect can be obtained by lowering the operating voltage (VDD). However, if the voltage VDD is lowered, then the driving current of the MOS transistors becomes so small that delay time of the circuit disadvantageously increases, resulting in the reduction of the operating speed. As a solution to this problem, it is conceivable to reduce the threshold voltage (Vth) of each MOS transistor such that the driving current of the MOS transistor is not reduced much even with a low voltage. However, if the threshold voltage Vth is reduced, then a leak current of the MOS transistor increases, and this leads to the problem that the power consumption increases great due to the existence of the leak current even in a standby mode.

SUMMARY OF THE INVENTION

Accordingly, an object of the present invention is to provide an SRAM and a semiconductor device that are each able to operate on a low voltage so as to consume very little power and that each have a small area.

In order to accomplish the above object, according to an aspect of the present invention, there is provided a static random access memory (SRAM) comprising MOS transistors which each include a channel-forming semiconductor region and a gate electrically connected with each other.

The MOS transistor whose gate is electrically connected with the channel-forming semiconductor region is referred to as "DTMOS (Dynamic Threshold MOS) transistor" or simply "DTMOS" herein. Because the gate is electrically connected with the channel-forming semiconductor region in the DTMOS transistors, each MOS transistor is controllable to have a low threshold voltage |Vth| in its ON stage and a high threshold voltage |Vth| in its OFF stage. This enables a low-voltage operation at 0.5 V and prevents leak current in the OFF stage from increasing. Thus, the SRAM of the present invention is allowed to consume less power than the conventional SRAM. Furthermore, because |Vth| of the DTMOS in the ON stage is low, the ON-state resistance is also small, and it is possible to increase the writing/reading speed. If the writing/reading speed for the DTMOS is maintained equivalent to the conventional speed, then it is possible to narrow the gate width to the extent according to a decrease of the ON-state resistance to thereby achieve the reduction in area of the SRAM.

In one embodiment, memory cells of the SRAM of the invention include N-type MOS transistors formed of DTMOS, and P-type MOS transistors having a channel-forming semiconductor region electrically connected with a power source.

According to the above construction, the N-type MOS transistors included in the memory cells or SRAM cells are DTMOS transistors. This allows the low-voltage operation, low consumption of power and high writing/reading speed of the SRAM cells. If the writing/reading speed is maintained equivalent to the conventional speed, then the reduction in area of the SRAM cells is achieved.

The PMOS transistors may have a gate oxide film larger in thickness than the N-type MOS semiconductor transistors.

In this case, because the ON-state resistance of the P-type MOS transistors increases, the current decreases, allowing the NMOS transistors to be constructed in a smaller size.

Therefore, it is possible to achieve a further reduction in area, a small leak current and a low consumption of power of the SRAM cells.

The channel-forming semiconductor region of each P-type MOS transistors may be formed of an N-type well deeper than a P-type well that forms the channel-forming semiconductor region of the N-type MOS transistor, and these channel-forming semiconductor regions are electrically isolated from each other.

In this case, no shallow wells, which need to be isolated from each other, are used for the P-type MOS transistors. Thus, the area of each SRAM cell decreases by that much.

In the above embodiment, the PMOS transistors of the memory cells can be replaced with resistors.

In one embodiment, the SRAM of the invention comprises write circuit means that include DTMOS transistors.

As described above, the DTMOS transistors have a low ON-state resistance and are able to suppress the leak current in the OFF stage. Therefore, the lower voltage operation, lower consumption of power, higher writing speed and size reduction of the write circuit are achieved.

In one embodiment, the DTMOS transistors of the write circuit include N-type DTMOS transistors which serve to make a bit line and an inverted bit line have a high-level electric potential, respectively.

In this case, at the time of writing to the memory cells, the high-level potentials of the bit line and the inverted bit line are reduced. Thus, a further reduction in consumption of power is achieved.

The SRAM of the invention may comprise read circuit means that includes DTMOS transistors.

Furthermore, according to another aspect of the present invention, there is provided a semiconductor device, comprising:

first MOS transistors for performing internal processing, which each have a channel-forming semiconductor region formed of a first well; and second MOS transistors for performing direct signal transmission and reception to and from an external device, which each have a channel-forming semiconductor region formed of a second well deeper than the first well.

The semiconductor device with this construction is a highly reliable semiconductor device with a high electrostatic withstand voltage.

DETAILED DESCRIPTION OF THE PREFERRED EMBODIMENTS

Figure 1:
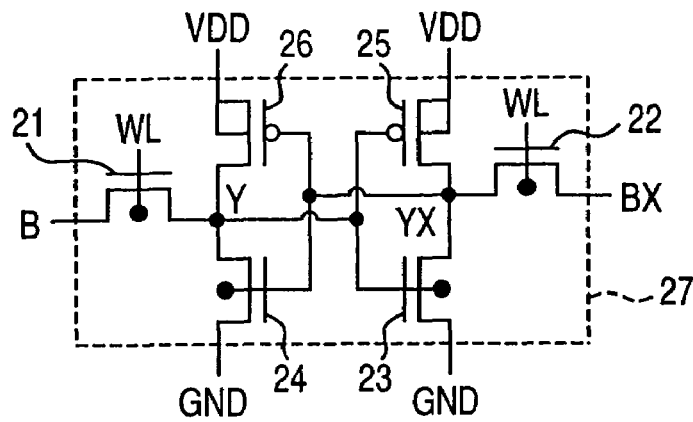
FIG. 1 is a circuit diagram of an SRAM cell that constitutes part of the SRAM of the present invention.

The present invention will be described in detail below on the basis of the embodiments shown in the drawings. FIG. 1 is a circuit diagram showing an example of SRAM cells of the SRAM according to the present embodiment. The SRAM cell 27 in the present embodiment is also constructed of two PMOS transistors and four NMOS transistors.

A bit line B is connected to the source (drain) of a first NMOS transistor 21. A word line WL is connected to the gates of the first NMOS transistor 21 and a second NMOS transistor 22. An inverted bit line BX is connected to the source (drain) of the second NMOS transistor 22.

The drain (source) Y that belongs to the first NMOS transistor 21 and is not connected to the bit line B is connected to the gates of a third NMOS transistor 23 and a first PMOS transistor 25 and further connected to the drains of a fourth NMOS transistor 24 and a second PMOS transistor 26.

The drain (source) XY that belongs to the second NMOS transistor 22 and is not connected to the inverted bit line BX is connected to the gates of the fourth NMOS transistor 24 and the second PMOS transistor 26 and further connected to the drains of the third NMOS transistor 23 and the first PMOS transistor 25.

The sources of the fourth NMOS transistor 24 and the third NMOS transistor 23 are connected to GND, while the sources of the first PMOS transistor 25 and the second PMOS transistor 26 are connected to VDD.

Figure 9:
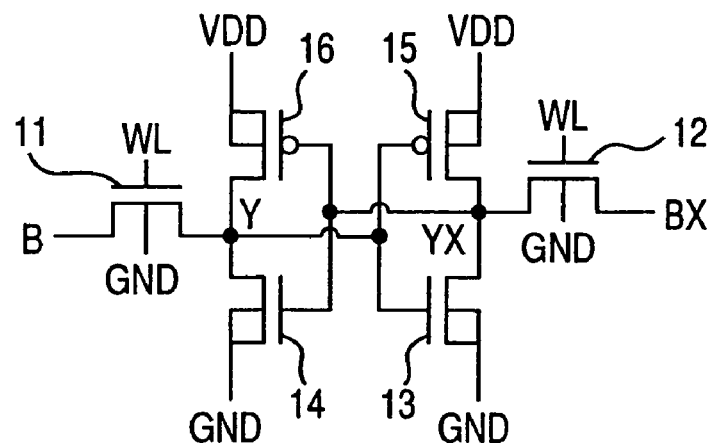
FIG. 9 is a circuit diagram of the conventional SRAM cell.
Figure 10:
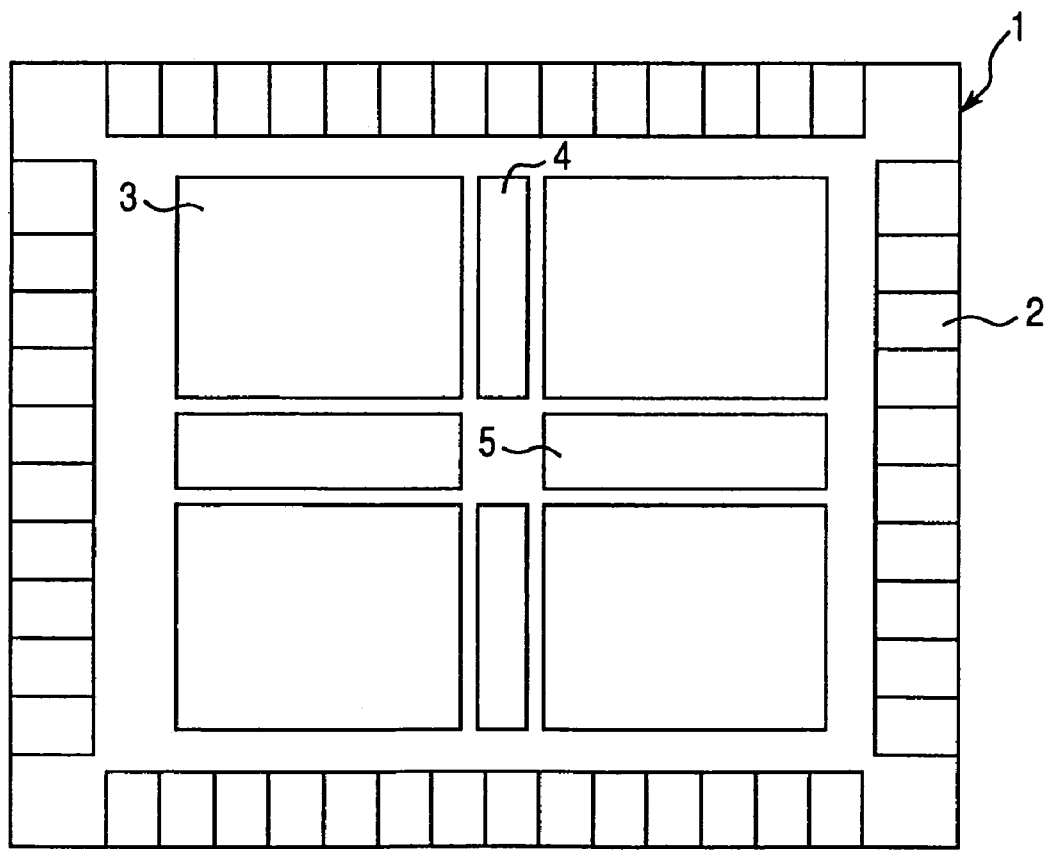
FIG. 10 illustrates the layout of an SRAM that employs the conventional SRAM cells.

In the present embodiment, the first NMOS transistor 21 through the fourth NMOS transistor 24 are constructed of the DTMOS (Dynamic Threshold MOS). On the other hand, semiconductor regions in which a channel is formed when each of the first PMOS transistor 25 and the second PMOS transistor 26 is turned on are connected to VDD, similarly to the conventional SRAM cell shown in FIG. 9.

Figure 2:
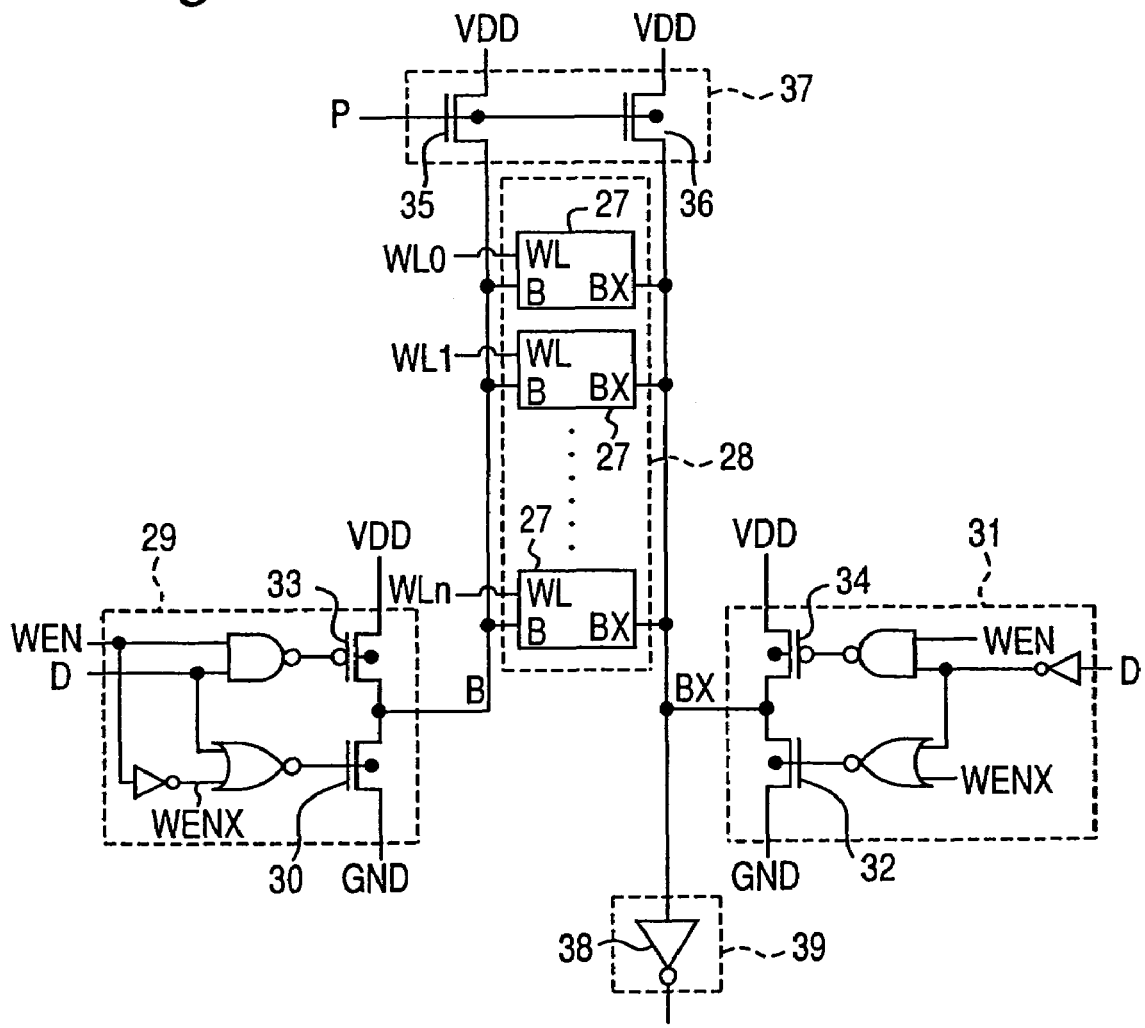
FIG. 2 is a diagram showing connection between an SRAM cell array constructed of the SRAM cells shown in FIG. 1, and a write circuit and a read circuit.

FIG. 2 is a circuit diagram showing the connection between an SRAM cell array 28 and a write circuit and a read circuit in the SRAM that employs the SRAM cells 27 having the aforementioned construction as storage elements. In this case, MOS transistors that constitute write circuits 29 and 31 and a read circuit 37 are all DTMOS (Dynamic Threshold MOS) transistors. The circuit shown in FIGS. 1 and 2 will be described below taking the case where the circuit is operated at VDD=0.5 V.

The following describes how to write data "0" to the SRAM cell 27 in a state storing data "1". The state storing data "1" is a state in which the first and second NMOS transistors 21 and 22 are off, the second PMOS transistor 26 is on and the fourth NMOS transistor 24 is off to place a node Y at the VDD level, and the first PMOS transistor 25 is off and the third NMOS transistor 23 is on to place a node XY at the GND level. In this state, data "0" is now written to the SRAM cell 27.

The bit line B is set to the GND (0) level and the inverted bit line BX is set to the VDD level by the write circuits 29 and 31, respectively. The word line WL of a selected SRAM cell 27 comes to the VDD level, so that the first and second NMOS transistors 21 and 22 of the selected SRAM cell 27 are both turned on. Therefore, the node Y has a potential obtained by dividing a potential difference (0.5 V) between VDD and GND by a sum of the ON-state resistance (RP2) of the second PMOS transistor 26, the ON-state resistance (RN1) of the first NMOS transistor 21 and the ON-state resistance (RNW1) of the NMOS transistor 30 of the write circuit 29 that is placing the bit line B at the GND level. That is, the potential VY of the node Y is expressed by the following equation (1):

$$VY=0.5\times(RN1+RNW1)/(RP2+RN1+RNW1) \quad (1)$$

The ON-state resistance (RP2) of the second PMOS transistor 26 has been set to a value great enough to reduce the potential VY of the node Y expressed by the equation (1) to such a low potential that can invert an inverter constructed of the third NMOS transistor 23 and the first PMOS transistor 25. At the same time, the ON-state resistance RN1 of the first NMOS transistor 21 and the ON-state resistance RNW1 of the NMOS transistor 30 have been set to small values. As a result, the inverter constructed of the third NMOS transistor 23 and the first PMOS transistor 25 is inverted during the writing of the data "0", whereby the potential of the node YX comes to have the VDD level.

Then, an inverter constructed of the second PMOS transistor 26 and the fourth NMOS transistor 24 is also inverted, with the second PMOS transistor 26 turned off and with the fourth NMOS transistor 24 turned on, with the result that the potential of the node Y comes to the GND level. This means completion of the writing of the data "0" to the selected SRAM cell 27. Subsequently, by lowering the word line WL to the GND level to turn off the first and second NMOS transistors 21 and 22, the data "0" is stored.

The case where the data "1" is written to the SRAM cell 27 storing the data "0" will be described next. The bit line B is set to the VDD level and the inverted bit line BX is set to the GND level by the write circuits 29 and 31, respectively. The word line WL of a selected SRAM cell 27 is placed at the VDD level, with the result that both the first and second NMOS transistors 21 and 22 of the SRAM cell 27 are turned on. Therefore, the node YX has a potential obtained by dividing the potential difference (0.5 V) between VDD and GND by a sum of the ON-state resistance (RP1) of the first PMOS transistor 25, the ON-state resistance (RN2) of the second NMOS transistor 22 and the ON-state resistance (RNW2) of the NMOS transistor 32 of the write circuit 31 that is placing the inverted bit line BX at the GND level. That is, the potential VYX of the node YX is expressed by the following equation (2):

$$VYX=0.5\times(RN2+RNW2)/(RP1+RN2+RNW2) \quad (2)$$

The ON-state resistance PR1 of the first PMOS transistor 25 has been set to a value large enough to make the potential VYX of the node YX expressed by the equation (2) low enough to invert the inverter constructed of the fourth NMOS transistor 24 and the second PMOS transistor 26. On the other hand, the ON-state resistance RN2 of the second NMOS transistor 22 and the ON-state resistance RNW2 of the NMOS transistor 32 have been set to small values. Therefore, when writing data "1", the inverter constructed of the fourth NMOS transistor 24 and the second PMOS transistor 26 is inverted and the potential of the node Y becomes the VDD level.

Then, the inverter constructed of the first PMOS transistor 25 and the third NMOS transistor 23 is also inverted, with the first PMOS transistor 25 turned off and with the third NMOS transistor 23 turned on, by which the potential of the node YX is brought to the GND level. This means completion of the writing of the data "1" to the selected SRAM cell 27. Subsequently, by placing the word line WL at the GND level to turn off the first and second NMOS transistors 21 and 22, the data "1" is stored.

The first NMOS transistor 21 through the fourth NMOS transistor 24 constituting the SRAM cell 27 of the present embodiment are formed of DTMOS transistors as described above. Furthermore, the NMOS transistors 30 and 32 and the PMOS transistors 33 and 34 of the write circuits 29 and 31 are also DTMOS transistors. The DTMOS is a transistor wherein a semiconductor region for forming a channel in the ON stage is connected to the gate, as described above. Therefore, |Vth| (Vth=threshold voltage) in the ON stage for the DTMOS becomes lower than when the channel has a potential of the GND level as in the case of the first NMOS transistor 11 through the fourth NMOS transistor 14 of the conventional SRAM cell shown in FIG. 9 or when the channel has a potential of the VDD level as in the case of the normal PMOS transistor. Thus, the ON-state resistance becomes low. In contrast, in the OFF stage, |Vth| of the DTMOS becomes as high as that of the first NMOS transistor 11 through the fourth NMOS transistor 14 of the conventional SRAM cell shown in FIG. 9 or the normal PMOS transistor.

Therefore, the MOS transistors 21–24, 30, and 32–34, which are constructed of the DTMOS, have a small ON-state resistance and a small leak current in the OFF stage. As a result, an SRAM cell 27 having a small area and a low consumption of power can be realized. Furthermore, write circuits 29 and 31 having a high write speed, a small area and a low consumption of power can be realized.

When reading data stored in the SRAM cell 27, the NMOS transistor 30 and PMOS transistor 33 of the write circuit 29 and the NMOS transistor 32 and PMOS transistor 34 of the write circuit 31 are turned off. Also, an NMOS transistor 35, provided between the bit line B and the power source voltage VDD, of the read circuit 37 and an NMOS transistor 36, provided between the inverted bit line BX and the power source voltage VDD, of the read circuit 37 are turned on for a certain period of time immediately after the address signal is switched, thereby pulling up the bit line B and the inverted bit line BX to the (VDD–Vthnon) level. Then, the NMOS transistors 35 and 36 are turned off after the lapse of time sufficient to pull up the bit line B and the inverted bit line BX to the (VDD–Vthnon) level. The "Vthnon" is a Vth when the NMOS transistor 35 and the NMOS transistor 36 are turned on.

With the NMOS transistors 35 and 36 thus turned off, a selected word line WL comes to have a potential of the VDD level. Consequently, the first NMOS transistor 21 and second NMOS transistor 22 of the selected SRAM cell 27 are turned on to lead the potential of the node Y to the bit line B and lead the potential of the node YX to the inverted bit line BX.

If the data "0" is stored in the SRAM cell 27, then the node Y before the first and second NMOS transistors 21 and 22 are turned on, is at the GND level. However, since the bit line B has been pre-charged with the potential (VDD–Vthnon), if the first and second NMOS transistors 21 and 22 are turned on, assuming that the ON-state resistance of the fourth NMOS transistor 24 is RN4, then the potential VY of the node Y temporarily becomes a potential expressed by the following equation (3):

$$VY=(VDD-Vthnon)\times RN4/(RN1+RN4) \quad (3)$$

In this case, the ON-state resistances RN4 and RN1 of the fourth NMOS transistor 24 and the first NMOS transistor 21 are set such that the potential VY of the node Y expressed by the equation (3) does not exceed the inversion voltage of the inverter constructed of the first PMOS transistor 25 and the third NMOS transistor 23. Therefore, the bit line B is discharged through the ON-state first NMOS transistor 21 and the ON-state fourth NMOS transistor 24 in the ON-state, and the bit line B turns to the GND level.

On the other hand, the potential of the node YX is VDD, and therefore, the potential of the inverted bit line BX remains unchanged at (VDD−Vthnon). Therefore, the level of an output Q becomes an L level via an inverter 38 of a read circuit 39, whereby the data "0" is read. Thereafter, the word line WL comes to have a potential at the GND level to turn off the first and second NMOS transistors 21 and 22, whereby the data stored in the SRAM cell 27 is held without being destroyed.

Likewise, if the data "1" is stored in the SRAM cell 27 and the second NMOS transistor 22 is turned on, then the potential VYX of the node YX temporarily becomes a potential expressed by the following equation (4):

$$VYX=(VDD-Vthnon) \times RN3/(RN2+RN3) \qquad (4)$$

where RN3 is an ON-state resistance of the third NMOS transistor 23. In this case, the ON-state resistances RN3 and RN2 of the third NMOS transistor 23 and the second NMOS transistor 22 are set such that the potential VYX of the node YX expressed by the equation (4) does not exceed the inversion voltage of the inverter constructed of the second PMOS transistor 26 and the fourth NMOS transistor 24. Therefore, the data stored in the SRAM cell 27 is not destroyed. The potential of the inverted bit line BX, which is at the GND level, is inverted by the inverter 38 and the data "1" is read at the output Q.

The NMOS transistors 35 and 36 constituting the read circuit 37 are each formed of DTMOS. Therefore, the transistors have a characteristic that the ON-state resistance is small and that the leak current is small in the OFF stage. Therefore, the pre-charging time for the bit line B and the inverted bit line BX can be shortened, allowing the area and the leak current to be reduced. It is to be noted that the same effect can be obtained by constructing the read circuit 37 of PMOS transistors comprised of DTMOS. If the inverter 38 constituting the read circuit 39 is a DTMOS inverter, then the read circuit is allowed to further reduce consumption of power and increase a reading speed.

Normally, in the aforementioned SRAM cell, the leak current in the OFF stage of each transistor must be suppressed low in order to reduce the consumption of power during the storing of data. In this case, the value of |Vth| of each MOS transistor should not be made excessively small. Therefore, according to the conventional SRAM cell shown in FIG. 9, in order to reduce the ON-state resistances RN11 and RN12 of the first and second first NMOS transistors 11 and 12 and the ON-state resistances of the two NMOS transistors (corresponding to the NMOS transistors 30 and 32 in FIG. 2) of the write circuit, the gate widths of the four NMOS transistors in the SRAM cell and the write circuit must be widened, and this disadvantageously increases the area of each NMOS transistor, and hence, the area of the SRAM cell.

If the gate widths of the four NMOS transistors are not widened, then the ON-state resistances of the first and second PMOS transistors 15 and 16 of the SRAM cell must be increased. For this purpose, the gate lengths of both the PMOS transistors 15 and 16 should be increased. Accordingly, the area of the SRAM cell is disadvantageously increased also in this case. In addition, if the gate lengths of the first and second PMOS transistors 15 and 16 are increased, there is a further problem that the writing/reading time increases due to the large ON-state resistances of the first and second NMOS transistors 11 and 12 during the writing or reading of the data to or from the SRAM cell.

In contrast to this, according to the present embodiment, the first NMOS transistor 21 through the fourth NMOS transistor 24 of the SRAM cell 27 are each constructed of DTMOS as described above. Therefore, the channel region voltages of the above four NMOS transistors 21 through 24 in the OFF stage are at the GND level, exhibiting the same characteristics as those of the first NMOS transistor 11 through the fourth NMOS transistor 14 of the conventional SRAM cell shown in FIG. 9. In contrast to this, the channel region voltages of the four NMOS transistors 21 through 24 in the ON stage are at the VDD level. Therefore, the value of |Vth| of the NMOS transistors 21 through 24 becomes smaller in the ON stage than in the OFF stage (i.e., smaller than |Vth| of the NMOS transistors 11 through 14 of the conventional SRAM cell). That is, the operation at a low voltage of 0.5 V, which has been difficult in the conventional SRAM cell, can be achieved, reducing the consumption of power in the operating stage. Furthermore, because the ON-state resistance is inversely proportional to a value (VGS−|Vth|) obtained by subtracting |Vth| from the gate voltage, the ON-state resistances of the NMOS transistors 21 through 24 of the SRAM cell 27 of the present embodiment become smaller than the ON-state resistances of the NMOS transistors 11 through 14 of the conventional SRAM cell. Therefore, the writing/reading speed can be made higher than in the case of the conventional SRAM cell. If the writing/reading speed is not required to be increased to be higher than the conventional SRAM cell, then the area of the memory cell can be reduced than in the conventional SRAM cell. Furthermore, the leak current in the OFF stage of the NMOS transistors 21 through 24 is the same as the leak current in the OFF stage of the NMOS transistors 11 through 14, and accordingly, there is no problem of the increase of the consumption of power in the standby stage.

The first and second PMOS transistors 25 and 26 of the SRAM cell 27 may have the same gate oxide film thickness as the gate oxide film thickness of the first through fourth NMOS transistors 21 through 24. However, by making the gate oxide film thickness of the first and second PMOS transistors 25 and 26 greater than the gate oxide film thickness of the first through fourth NMOS transistors 21 through 24, it is enabled to increase the ON-state resistances of the first and second PMOS transistors 25 and 26 for the reduction of the current value and thereby construct the first NMOS transistor 21 through the fourth NMOS transistor 24 as well as the first and second PMOS transistors 25 and 26 in smaller size. Therefore, in such a case, an SRAM cell of a smaller area, a smaller leak current and a lower consumption of power can be provided.

Figure 3:
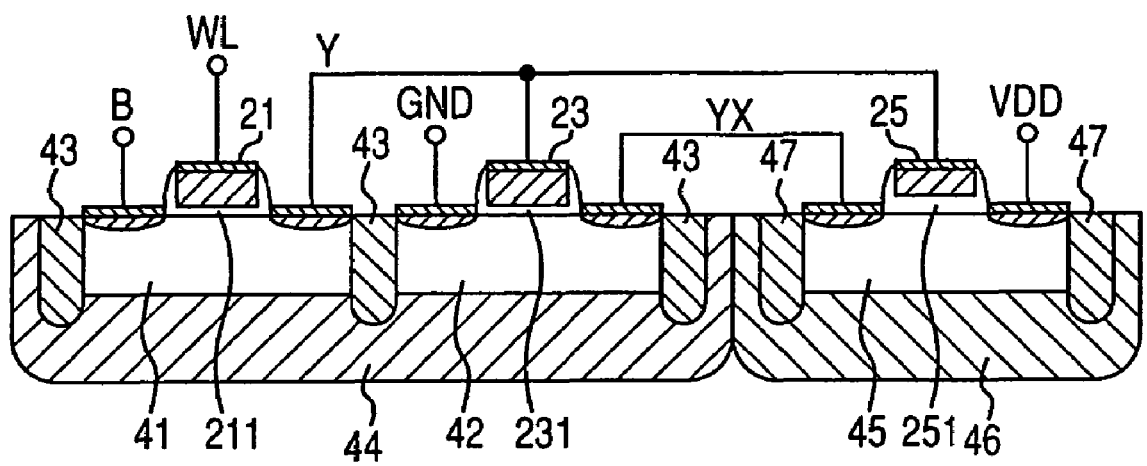
FIG. 3 is a partial sectional view of the SRAM cell shown in FIG. 1.

FIG. 3 is a partial sectional view of the SRAM cell 27 shown in FIG. 1, showing the double-well structure of a deep well and a shallow well. Shallow P-wells 41 and 42 in which the first and third NMOS transistors 21 and 23 are formed are electrically isolated for each NMOS transistor 21, 23 by trenches 43 and a deep N-well 44. Then, the gate of the first NMOS transistor 21 is connected to the shallow P-well 41, while the gate of the third NMOS transistor 23 is connected to the shallow P-well 42, each transistor forming the DTMOS. Further, the deep N-well 44 is connected to VDD.

A shallow N-well 45 in which the first PMOS transistor 25 is formed is connected to VDD, while a deep P-well 46 is connected to GND. The first PMOS transistor 25 (second PMOS transistor 26) may be constructed of DTMOS, but in order to increase the ON-state resistance while keeping a small area, it is better to connect the shallow N-well 45 to VDD.

A gate oxide film 251 of the first PMOS transistor 25 has-a film thickness larger than a film thickness of gate oxide films 211 and 231 of the first and third NMOS transistors 21 and 23. Similarly, although not shown, a gate oxide film of the second PMOS transistor 26 has a film thickness larger than a film thickness of gate oxide films of the second and fourth NMOS transistors 22 and 24.

Figure 4:
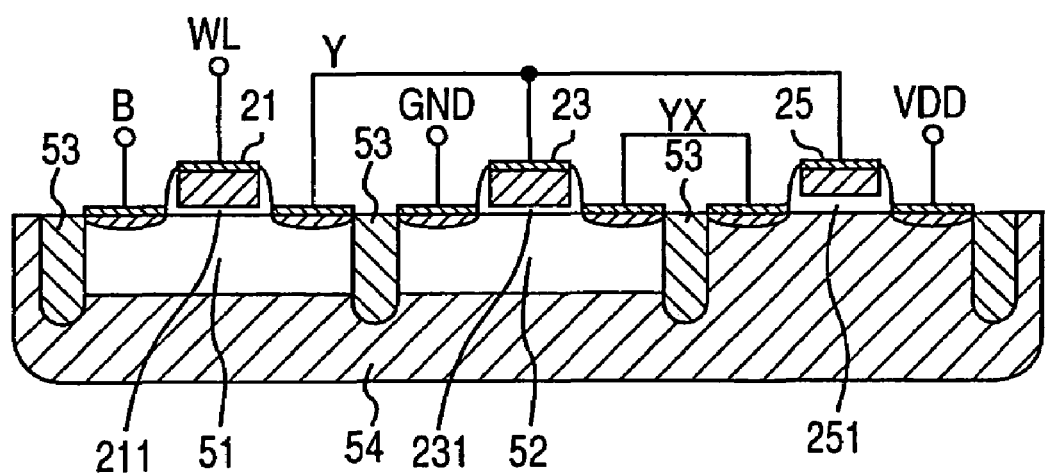
FIG. 4 is a partial sectional view of a modification of the SRAM cell of FIG. 1.

FIG. 4 is a modified structure of the SRAM cell 27 shown in FIG. 3. Shallow P-wells 51 and 52 in which the first and third NMOS transistors 21 and 23 are formed are electrically isolated for each of the MOS transistors 21 and 23 by trenches 53 and a deep N-well 54. Then, the gate of the first NMOS transistor 21 is connected to the shallow P-well 51, while the gate of the third NMOS transistor 23 is connected to the shallow P-well 52, each transistor forming the DTMOS. Further, the deep N-well 54 is connected to VDD.

Referring back to the structure of FIG. 3, although not completely shown in FIG. 3, the shallow N-wells in which the first and second PMOS transistors 25 and 26 are formed are electrically isolated for each PMOS transistor by trenches 47 and a deep P-well 46. However, the semiconductor regions in the SRAM cell 27 for forming channels of the first and second PMOS transistors 25 and 26 have a potential of the VDD level in common, which means that there is no need of isolating the shallow N-wells 45 for each of the first and second PMOS transistors 25 and 26.

Therefore, in the modified structure of FIG. 4, both the first PMOS transistor 25 and the second PMOS transistor 26 are formed in the deep N-well region 54 (to which the voltage of VDD is applied) which serves to isolate the shallow P-wells 51 and 52. This arrangement obviates the need of forming the shallow N-wells and the deep P-well in the SRAM cell 27 region. Accordingly, the area of the SRAM cell 27 can be made smaller than in the structure shown in FIG. 3.

The structures shown in FIG. 3 and FIG. 4 are examples in which the SRAM cell 27 is formed on a silicon monocrystal substrate. Alternatively, the SRAM cell 27 shown in FIG. 1 and the SRAM shown in FIG. 2 can be formed on an SOI (Silicon-On-Insulator) substrate. Although FIG. 3 and FIG. 4 show only the relation between the first NMOS transistor 21, the third NMOS transistor 23 and the first PMOS transistor 25, the same thing can be said for the relation between the second NMOS transistors 22 and 24 and the second PMOS transistor 26.

Figure 5:
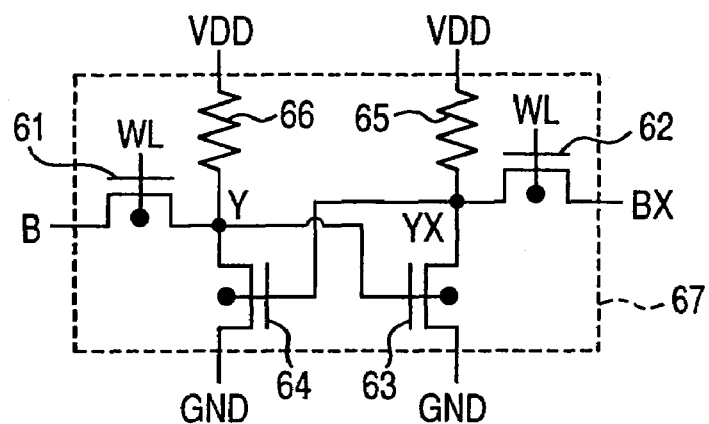
FIG. 5 is a circuit diagram of an SRAM cell different from that of FIG. 1.

FIG. 5 shows an SRAM cell 67 in which the first and second PMOS transistors 25 and 26 of the SRAM cell 27 shown in FIG. 1 are replaced by a first resistor 65 and a second resistor 66. It is to be noted that a first NMOS transistor 61 through a fourth NMOS transistor 64 correspond to the first NMOS transistor 21 through the fourth NMOS transistor 24, respectively, of the SRAM cell 27 shown in FIG. 1. In this case, the first and second resistors 65 and 66 are formed of high-resistance polysilicon or a thin-film transistor (TFT) or the like.

When writing data "0" to the SRAM cell 67 in a state in which data "1" has been written (node Y→VDD, node YX→GND), the second resistor 66 is made to have a high-resistance value RP2 so that the voltage VY at the node Y expressed by the equation (1) above becomes a voltage that is able to invert the inverter constructed of the first resistor 65 and the third NMOS transistor 63. On the other hand, when writing data "1" in a state in which data "0" has been written (node Y→GND, node YX→VDD), the first resistor 65 is made to have a high-resistance value RP1 so that the voltage VYX of the node YX expressed by the equation (2) above becomes a voltage that is able to invert the inverter constructed of the second resistor 66 and the fourth NMOS transistor 64. By so doing, the SRAM cell 67 shown in FIG. 5 operates similarly to the SRAM cell 27 shown in FIG. 1 to execute the data writing.

Figure 6:
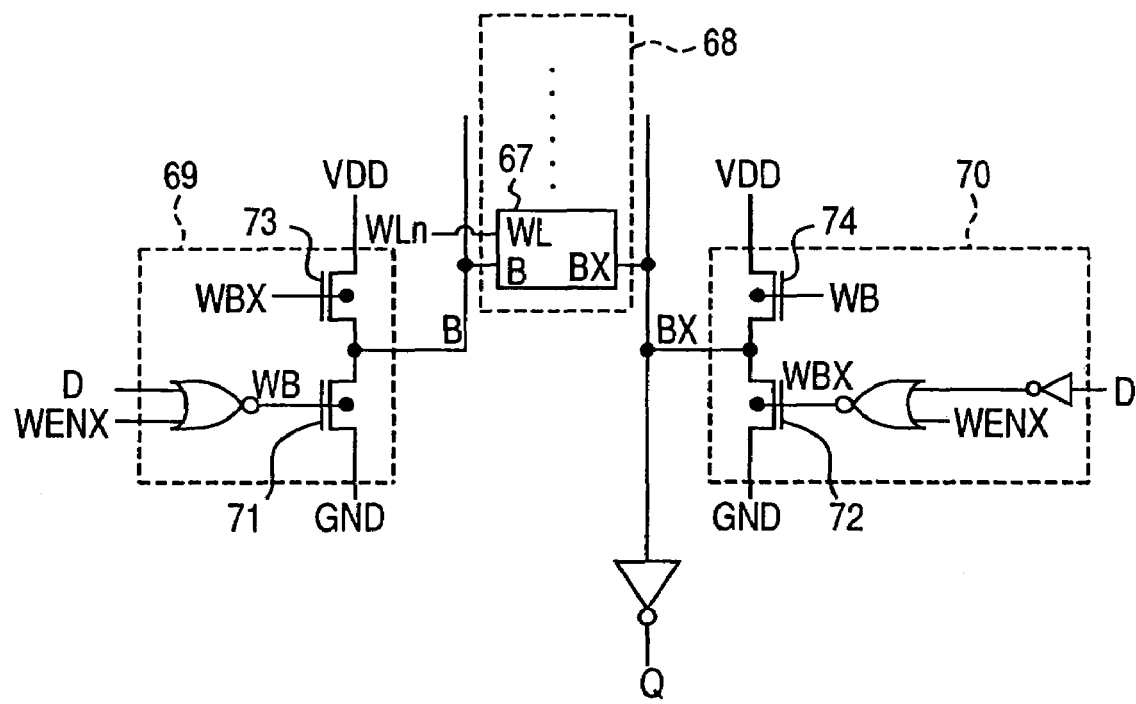
FIG. 6 is a diagram showing connection between an SRAM cell array constructed of the SRAM cells shown in FIG. 5 or FIG. 1, and a write circuit and a read circuit.

FIG. 6 is a circuit diagram showing the connection between an SRAM cell array 68 and write circuits 69 and 70 in the SRAM that employs the above SRAM cell 67 as a storage element. A write circuit 69 has a construction in which an NMOS transistor 73 having the DTMOS structure replaces the PMOS transistor 33 of the write circuit 29 shown in FIG. 2. On the other hand, a write circuit 70 has a construction in which an NMOS transistor 74 having the DTMOS structure replaces the PMOS transistor 34 of the write circuit 31 shown in FIG. 2. An NMOS transistor 71 of the write circuit 69 corresponds to the NMOS transistor 30 of the write circuit 29 shown in FIG. 2. An NMOS transistor 72 of the write circuit 70 corresponds to the NMOS transistor 32 of the write circuit 31 shown in FIG. 2. The gates of the NMOS transistors 73 and 74 are supplied with inverted signals WBX and WB of input signals WB and WBX supplied to the gates of the NMOS transistors 71 and 72, respectively.

According to the above construction, the write circuits 69 and 70 become simpler than the write circuits 29 and 31 shown in FIG. 2. In addition, the potentials in the writing stage of the bit line B and the inverted bit line BX assume the (VDD−Vthnon) level. Therefore, the consumption of power becomes lower than in the case of the write circuits 29 and 31 (VDD) shown in FIG. 2.

Figure 7:
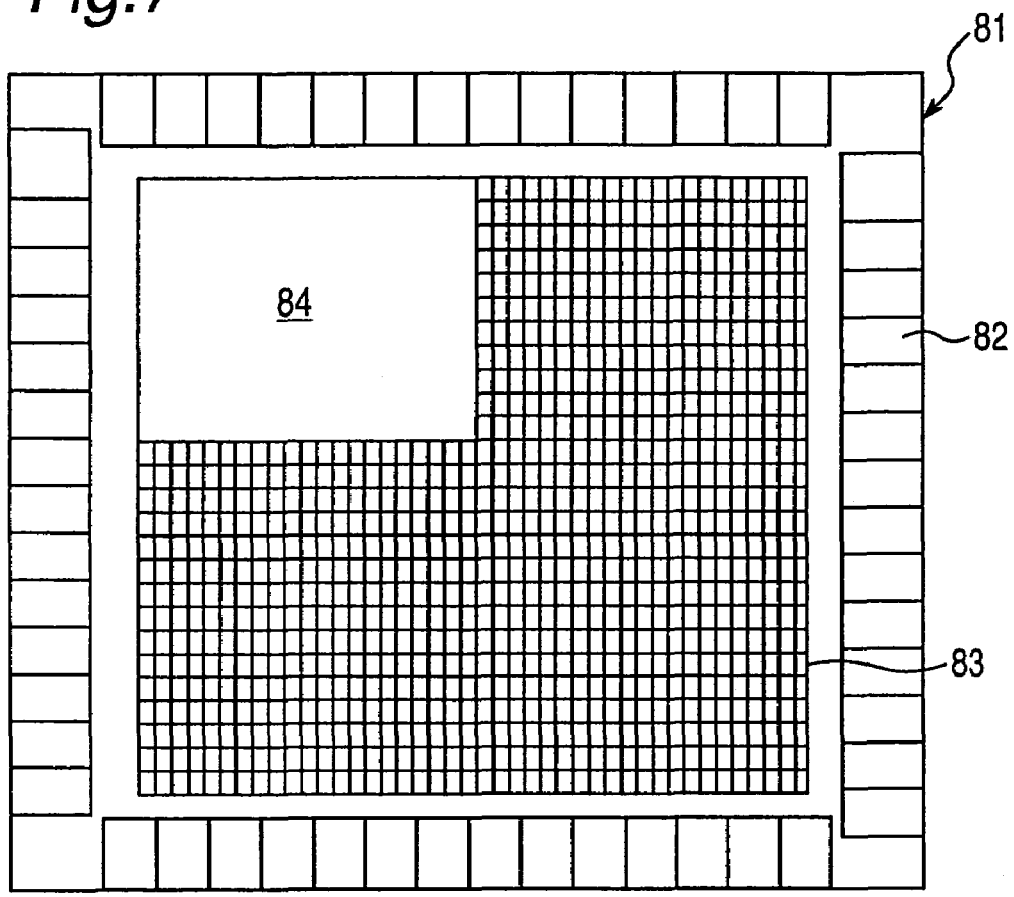
FIG. 7 illustrates the layout of a semiconductor device that employs the SRAM cells shown in FIG. 1 or FIG. 5.

FIG. 7 shows the layout of a semiconductor device mounted with the SRAM of the present embodiment. The semiconductor device 81 is constructed roughly of an interface section 82 with an external device, a logic circuit section 83, and an SRAM section 84. The logic circuit section 83 and the SRAM section 84 are regions that operate at 0.5 V. The interface section 82 is provided with a region that operates at a voltage (3 V, for example) higher than 0.5 V and a region that operates at 0.5 V. That is, the interface section 82 is constructed of a circuit for converting an externally supplied signal having an amplitude of 3 V into a signal having an amplitude of 0.5 V and supplying the signal to the inside and a circuit for converting the internal signal having the amplitude of 0.5 V into a signal having the amplitude of 3 V and supplying the signal to the outside.

Figure 8:
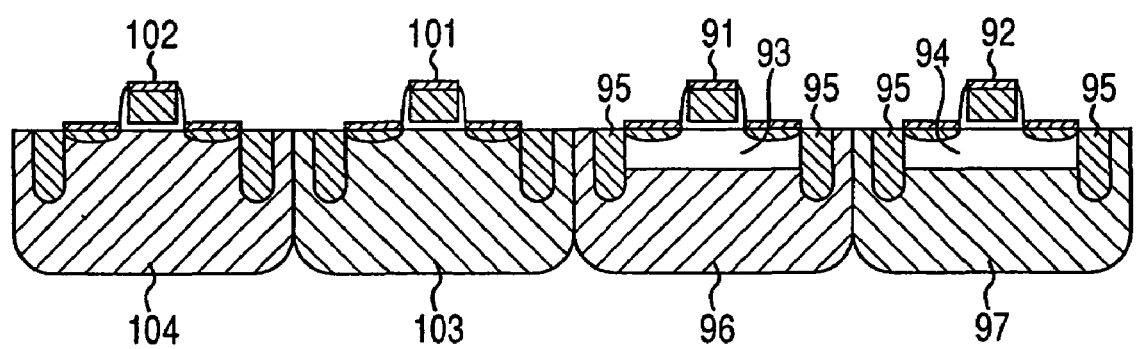
FIG. 8 is a partial sectional view of an interface section in FIG. 7.

FIG. 8 is a sectional view of part of the interface section 82, showing the double structure of a deep well and a shallow well. An NMOS transistor 91 and a PMOS transistor 92 both operating at 0.5 V are formed in a shallow P-well 93 and a shallow N-well 94, respectively and are electrically isolated by trenches 95, a deep N-well 96 and a deep P-well 97. In contrast to this, an NMOS transistor 101 and a PMOS transistor 102 both operating at 3 V are formed in a deep P-well 103 and a deep N-well 104, respectively, and are electrically isolated. This arrangement is intended to improve the reliability with regard to the electrostatic withstand voltage and so on since the MOS transistors 101 and 102 operating at 3 V transmit and receive signals directly to and from an external device. It is a matter of course that protector circuits are provided around the deep wells 96, 97, 103 and 104, similarly to conventional semiconductor devices.

As described above, according to the present embodiment, the NMOS transistors of the SRAM cells 27 and 67 are each constructed of DTMOS wherein the channel region is connected to the gate. Also, the MOS transistors 30 and 33, 32 and 34; 71 and 73, and 72 and 74 of the write circuits 29, 31; 69 and 70 of the SRAM that employ the SRAM cells 27, 67 are each constructed of DTMOS. Further, the NMOS transistors 35 and 36 constituting the read circuit 37 are each constructed of DTMOS. Therefore, a value of |Vth| of the DTMOS in the ON stage can be made lower than a value of |Vth| in the OFF stage, enabling the low-voltage operation at 0.5 V, which was impossible before, and hence the reduction of consumption of power in the operating stage. Still, |Vth| of the DTMOS in the OFF stage is the same as that of ordinary MOS transistors. Therefore, leak current in the OFF stage of the DTMOS is equivalent to that of the conventional SRAM cell, so that the power consumption in the standby stage can be prevented from increase.

Each MOS transistor constructed of DTMOS has a low value of |Vth| in the ON stage, and hence a small ON-state resistance. Therefore, the writing/reading speed can be made faster than that of the conventional SRAM that employs no DTMOS. If the writing/reading speed is not needed to increase to be higher than that of the conventional SRAM, then the gate width of the DTMOS can be narrowed by the smallness of the ON-state resistance. Thus, the area of the DTMOS, and hence, the area of the SRAM cell and the area of the SRAM can be narrowed.

Furthermore, in the write circuits 69 and 70 of the SRAM shown in FIG. 6, the transistors for making the bit line B and the inverted bit line BX have a potential of a high level are each constructed of an NMOS transistor having the aforementioned DTMOS structure. Therefore, the potentials of the bit line B and the inverted bit line BX in the writing stage are allowed to have the (VDD−Vthnon) level, achieving a consumption of power lower than in the case of the write circuits 29 and 31 of the SRAM shown in FIG. 2.

The shallow wells 93 and 94 form channel regions of the MOS transistors 91 and 92 which are included in the interface section 82 of the semiconductor device having the built-in SRAM cells 27 or 67 and which operate at 0.5 V. In contrast to this, the deep wells 103 and 104 form channel regions of the MOS transistors 101 and 102 of the interface section 82 that operate at 3 V. Therefore, these MOS transistors 101 and 102 are improved in reliability with regard to the electrostatic withstand voltage and so on.

What is claimed is:

1. A semiconductor device, comprising:
   an inner region including an SRAM section and/or a logic circuit section, and having MOS transistors operating at a first voltage; and
   an outer region including an interface section and located outside of the inner region, wherein
   said interface section comprises first MOS transistors operating at the first voltage and second MOS transistors operating at a second voltage higher than the first voltage and performing direct signal transmission and reception to and from an external device,
   said first MOS transistors each have a channel-forming semiconductor region formed of a first well, and
   said second MOS transistors each have a channel-forming semiconductor region formed of a second well deeper than the first well.

* * * * *